(12) United States Patent
Moon

(10) Patent No.: US 8,866,374 B2
(45) Date of Patent: Oct. 21, 2014

(54) LIGHT EMITTING DEVICE HAVING A MULTILAYER RE-EMISSION LAYER AND LIGHT EMITTING DEVICE PACKAGE INCLUDING THE SAME

(75) Inventor: Tae Yong Moon, Seongnam-si (KR)

(73) Assignee: LG Innotek Co., Ltd., Seoul (KR)

( * ) Notice: Subject to any disclaimer, the term of this patent is extended or adjusted under 35 U.S.C. 154(b) by 740 days.

(21) Appl. No.: 13/080,706

(22) Filed: Apr. 6, 2011

(65) Prior Publication Data

US 2011/0249468 A1  Oct. 13, 2011

(30) Foreign Application Priority Data

Apr. 9, 2010  (KR) .................. 10-2010-0032558

(51) Int. Cl.
*H01L 33/20* (2010.01)
*H01L 33/50* (2010.01)
*H01L 33/08* (2010.01)

(52) U.S. Cl.
CPC ............ *H01L 33/08* (2013.01); *H01L 33/50* (2013.01)
USPC ........................... 313/501; 257/95

(58) Field of Classification Search
CPC ....... H01J 33/502; H01J 33/504; H01J 33/08; H01L 33/502; H01L 33/504; H01L 33/08; H01L 33/50; H01L 33/505; H01L 33/508
USPC ...................... 313/501; 257/95–97
See application file for complete search history.

(56) References Cited

U.S. PATENT DOCUMENTS

| 7,045,375 B1 | 5/2006 | Wu et al. |
| 2003/0006430 A1 | 1/2003 | Shibata et al. |
| 2005/0184305 A1 * | 8/2005 | Ueda ............................. 257/99 |
| 2008/0179606 A1 | 7/2008 | Usuda et al. |
| 2009/0101934 A1 | 4/2009 | Massies et al. |

FOREIGN PATENT DOCUMENTS

| CN | 101238593 | 8/2008 |
| CN | 101238593 A | 8/2008 |
| CN | 101418931 | 4/2009 |
| CN | 101418931 A | 4/2009 |
| JP | 2002-185042 | 6/2002 |
| JP | 2006-100475 | 4/2006 |
| KR | 10-2005-0100128 | 10/2005 |
| KR | 10-2006-0034451 | 4/2006 |
| KR | 10-2006-0072445 | 4/2006 |
| KR | 10-2009-0004403 | 1/2009 |
| TW | 200746231 | 12/2007 |

* cited by examiner

*Primary Examiner* — Nimeshkumar Patel
*Assistant Examiner* — Steven Horikoshi
(74) *Attorney, Agent, or Firm* — McKenna Long & Aldridge LLP

(57) ABSTRACT

A light emitting device includes a light emitting structure comprising a first conductivity type semiconductor layer, a second conductivity type semiconductor layer and an active layer disposed between the first conductivity type semiconductor layer and the second conductivity type semiconductor layer to emit a light of a first wavelength; and a re-emission layer disposed on the light emitting structure, the re-emission layer comprising a nitride semiconductor, wherein the re-emission layer absorbs the light of the first wavelength range and the re-emission layer emits a light of a second wavelength range longer than the first wavelength range, and the re-emission layer is configured of multi layers having different indium (In) compositions, respectively, and the indium content in the multi-layer is largest in a top layer of the multi-layers.

20 Claims, 9 Drawing Sheets

LIGHT EMITTING DEVICE HAVING A MULTILAYER RE-EMISSION LAYER AND LIGHT EMITTING DEVICE PACKAGE INCLUDING THE SAME

CROSS REFERENCE TO RELATED APPLICATION

Pursuant to 35 U.S.C. §119(a), this application claims the benefit of the Patent Korean Application No. 10-2010-0032558, filed on Apr. 9, 2010, which is hereby incorporated by reference as if fully set forth herein.

BACKGROUND OF THE DISCLOSURE

1. Field of the Disclosure

The present invention relates to a light emitting device and a light emitting device package.

2. Discussion of the Related Art

Owing to development of thin film growth and thin film device elements, a light emitting device including a light emitting diode and a laser diode, which use 3-5 group or 2-6 group compound semiconductor elements of a semiconductor, can present a variety of colors, for example, red, green and blue colors and an infrared ray. Fluorescence material usage or color combination allows the light emitting device to present a white light having good luminous efficiency. Compared with a conventional light source such as a fluorescent lamp and an incandescent lamp, such the light emitting device has several advantages of low power consumption, semipermanent usage, fast response speed, safety and environment-friendliness.

The light emitting device has been applied to a transmission module of light communication means, a light emitting diode backlight replacing a cold cathode fluorescence lamp (CCFL) composing a backlight of a liquid crystal display (LCD) device, a white light emitting diode lightening device replacing a fluorescent lamp and an incandescent lamp, a headlight of a vehicle and even to a traffic light broadly.

SUMMARY OF THE DISCLOSURE

The present invention is directed to a light emitting device and a light emitting device package.

The present invention is to provide a light emitting device having improved luminous efficiency.

The disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings. To achieve these objects and other advantages and in accordance with the purpose of the invention, as embodied and broadly described herein, a light emitting device includes a light emitting structure comprising a first conductivity type semiconductor layer, a second conductivity type semiconductor layer and an active layer disposed between the first conductivity type semiconductor layer and the second conductivity type semiconductor layer to emit a light of a first wavelength; and a re-emission layer disposed on the light emitting structure, the re-emission layer comprising a nitride semiconductor, wherein the re-emission layer absorbs the light of the first wavelength range and the re-emission layer emits a light of a second wavelength range longer than the first wavelength range, and the re-emission layer is configured of multi layers having different indium (In) compositions, respectively, and the indium content in the multi-layers is largest in a top layer of the multi-layers.

The light of the first wavelength range may include a blue light.

The light of the first wavelength may include a UV light.

The re-emission layer may have an InGaN layer.

The re-emission layer may have InxAlyGa1-x-yN layer ($0 \leq x, y \leq 1$).

The light emitting structure may include a concavo-convex structure disposed in a surface thereof.

The re-emission layer may be disposed on the concavo-convex structure of the light emitting structure, with a predetermined thickness.

The re-emission layer may include a concavo-convex structure disposed according to the concavo-convex structure of the light emitting structure.

The re-emission layer may be conformally coated on the light emitting structure.

The re-emission layer may be disposed on the first conductivity type semiconductor layer or the second conductivity type semiconductor layer.

The re-emission layer may be disposed on an n-type semiconductor layer or a p-type semiconductor.

The light emitting device may further include an electrode disposed on the re-emission layer.

The electrode may include a metal selected from a group consisting of molybdenum, chromium (Cr), nickel (Ni), gold (Au), aluminum (Al), titanium (Ti), platinum (Pt), vanadium (V), tungsten (W), lead (Pd), copper (Cu), rhodium (Rh) and iridium (Ir) or an alloy of the metals.

The light emitting device may further include an ohmic layer disposed on the second conductivity type semiconductor layer.

The ohmic layer may include at least one selected from a group consisting of ITO, IZO, IZTO, IAZO, IGZO, IGTO, AZO, ATO, GZO, IZON, AGZO, IGZO, ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au and Hf.

The light emitting device may further include a metal support disposed on the ohmic layer.

The metal support may include at least one selected from a group consisting of a selected material from a group of Mo, Si, W, Cu and Al or an alloy of the group, Au, CuAlloy, Ni-nickel, Cu—W and carrier wafer.

The re-emission layer may be disposed on a surface of each of the first conductivity type semiconductor layer and the second conductivity type semiconductor layer.

In another aspect of the present invention, a light emitting device package includes a package body; a light emitting device disposed on the package body; the light emitting device comprising a light emitting structure comprising a first conductivity type semiconductor layer, an active layer disposed on the first conductivity type semiconductor layer to emit a light of a first wavelength range and a second conductivity type semiconductor layer disposed on the active layer, with a second electrode; and a re-emission layer disposed on the second conductivity type semiconductor layer, the re-emission layer configured of a nitride semiconductor and configured to absorb the light of the first wavelength range to emit a light of a second wavelength range longer than the first wavelength range; first and second electrode layers disposed on the package body, the first and second electrode layers connected with the light emitting device; and a filling material configured to surround the light emitting device, wherein the re-emission layer is configured of multi-layers having different indium (In) compositions, respectively, and the indium content in the multi-layers is largest in a top layer of the multi-layers.

In a further aspect of the present invention, a lightening system includes a light source module comprising a substrate and a light emitting device disposed on the substrate; a light guide plate configured to guide a light emitted from the light source module; an optical sheet disposed on a front surface of the light guide plate, to diffuse the light guided from the light guide plate; and a bottom cover configured to receive the light source module, the light guide plate and the optical sheet therein, wherein the light emitting device comprises a light emitting structure comprising a first conductivity type semiconductor layer, an active layer disposed on the first conductivity type semiconductor layer to emit a light of a first wavelength and a second conductivity type semiconductor layer disposed on the active layer, with a second electrode provided thereon; and a re-emission layer disposed on the second conductivity type semiconductor layer, the re-emission layer configured of a nitride semiconductor and configured to absorb the light of the first wavelength range to emit a light of a second wavelength range longer than the first wavelength range, and the re-emission layer is configured of multi-layers having different indium (In) compositions, respectively, and the indium content in the multi-layer is largest in a top layer of the multi-layers.

According to the light emitting device, the method for fabricating the light emitting device and a light emitting device package, luminous efficiency may be enhanced.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

In the drawings.

DESCRIPTION OF SPECIFIC EMBODIMENTS

Figure 1:
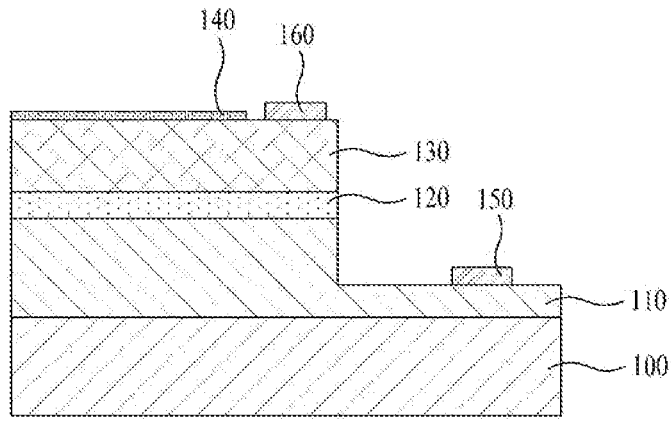
FIG. 1 is a side sectional view illustrating a first embodiment of a light emitting device.

Reference will now be made in detail to the specific embodiments of the present invention, examples of which are illustrated in the accompanying drawings. Wherever possible, the same reference numbers will be used throughout the drawings to refer to the same or like parts.

As follows, exemplary embodiments of the present invention capable of embodying the object of the present invention will be described in reference to the accompanying drawings.

If it is disclosed in description of the embodiments that each of layers (films), regions, patterns and structures is disposed "on" or "under" a substrate, each of corresponding layers (film), regions, pads or patterns, the expression of "on" and "under" may include "directly formed on and under" and "indirectly formed on and under, with another layer disposed there between". "On" and "under" of each of the layers will be described by a standard of the accompanying drawings.

The thickness and size of each layer may be exaggerated, emitted or illustrated schematically in the drawings, for explanation and precision. The size of each component shown in the drawings may not reflect the actual size completely.

FIG. 1 is a side sectional view illustrating a first embodiment of a light emitting device As follows, the first embodiment of a light emitting device will be described in reference to FIG. 1

As shown in the drawing, the light emitting device includes a substrate 100, a light emitting structure including a first conductivity type semiconductor layer 110 provided on the substrate 100, an active layer disposed on the first conductivity type semiconductor layer 110 to emit a light and a second conductivity type semiconductor layer 130 disposed on the active layer 120, and a re-emission layer 140 disposed on the second conductivity type semiconductor layer 130.

The active layer is a layer capable of generating a light having a variety of wavelengths according to embodiments and a range of the wavelengths of the generated light is not limited.

A first electrode 150 is provided on the first conductivity type semiconductor layer 110 and a second electrode 160 may be provided on the second conductivity type semiconductor layer 130.

The substrate 100 includes a conductive substrate or dielectric substrate and it may use at least one selected from a group consisting of sapphire (Al2O3), SiC, Si, GaAs, GaN, ZnO, Si, GaP, InP, Ge, and Ga2O3, for example. A concavo-convex structure may be disposed on the substrate 100 and the present invention may not be limited thereto. Wet cleaning may be performed to the substrate 100 and impurities may be eliminated from a surface of the substrate 100.

A buffer layer (not shown) may grow between the light emitting structure and the substrate 100 and the buffer layer is provided to reduce lattice mismatch and difference of thermal expansion coefficient. The buffer layer may be formed of a 3-5 group compound semiconductor, for example, at least one selected from a group consisting of GaN, InN, AlN, InGaN, AlGaN, InAlGaN and AlInN. An undoped semiconductor layer may be disposed on the buffer layer and the present invention may not be limited thereto. The first conductivity type semiconductor layer 110 may be disposed on the substrate 100.

The first conductivity type semiconductor layer 110 may be embodied by a 3-5 group compound semiconductor having a first conductivity type dopant doped thereon. If the first conductivity type semiconductor layer 110 is an n-type semiconductor layer, the first conductivity type dopant may include Si, Ge, Sn, Se and Te as n-type dopant and the present invention is not limited thereto.

The first conductivity type semiconductor layer 110 may include a semiconductor material having an empirical formula: $Al_xIn_yGa_{(1-x-y)}N$ ($0 \leq x \leq 1$, $0 \leq y \leq 1$, $0 \leq x+y \leq 1$). The first conductivity type semiconductor 110 may be formed of one or more of GaN, InN, AlN, InGaN, AlGaN, InAlGaN, AlInN, AlGaAs, InGaAs, AlInGaAs, GaP, AlGaP, InGaP, AlInGaP and InP.

The active layer 120 is a layer configured to emit a light having a predetermined energy determined by an unique energy band of an active layer (light emitting layer) after an electron injected via the first conductivity type semiconductor layer 110 meets a hole injected via the second conductivity type semiconductor layer 130 which will be formed later.

The active layer 120 may be formed in at least one of Single Quantum Well structure, Multi Quantum Well (MQW) structure, Quantum-Wire structure and Quantum Dot structure. For example, trimethylgallium gas (TMGa), ammonia gas (NH3), nitrogen gas (N2) and trimethylindium gas (TMIn) are injected to form the active layer 120 in MQW structure and the present invention is not limited thereto.

A well layer/barrier layer structure of the active layer 120 may be formed of one or more of InGaN/GaN, InGaN/InGaN, GaN/AlGaN, InAlGaN/GaN, GaAs(InGaAs)/AlGaAs, GaP(InGaP)/AlGaP pair structures and the present invention is not limited thereto. The well layer may be formed of material with a predetermined band gap lower than a band gap of the barrier layer.

A conductivity type clad layer (not shown) may be disposed on and/or under the active layer 120. The conductivity type clad layer may be formed of AlGaN-group material and it may have a higher band gap than the band gap of the active layer 120.

The second conductivity type semiconductor layer 130 may include a 3-5 group compound semiconductor having a second conductivity type dopant doped thereon, for example, a semiconductor material having an empirical formula: $In_xAl_yGa_{1-x-y}N$ ($0 \leq x \leq 1$, $0 \leq y \leq 1$, $0 \leq x+y \leq 1$). If the second conductivity type semiconductor layer 130 is a p-type semiconductor layer, the second conductivity type dopant may include Mg, Zn, Ca, Sr and Ba as p-type dopant.

This embodiment may present that the first conductivity type semiconductor layer 110 is a p-type semiconductor layer and that the second conductivity type semiconductor type layer 130 is an n-type semiconductor layer. On the second conductivity type semiconductor layer 130 may be formed a semiconductor having an opposite pole to a pole of the second conductivity type, for example, an n-type semiconductor layer (not shown) if the second conductivity type semiconductor layer is a p-type semiconductor layer. Because of that, the light emitting structure may be presented with one of N-P, N-P-N and P-N-P junction structures.

The re-emission layer 140 grows on the second conductivity type semiconductor layer 130. Here, the re-emission layer 140 may grow as InGaN multi-thin-film layer with each thin film having a different indium composition. At this time, the re-emission layer 140 may be configured of thin films having different indium compositions, respectively. A thin film layer having a large indium content is located on a top of the multi-thin-film layer. The indium content in the multi-layers is largest in a top layer of the multi-layers.

Because of that, crystallization defect of a thin film caused by the large indium content may not be related to an electrical operation of the device. Here, "the top" means a layer provided farthest from the second conductivity type semiconductor layer 130. alternatively, the re-emission layer 140 may grow as multi-thin-film layer having an empirical formula: $In_xAl_yGa_{1-x-y}N$ ($0 \leq x \leq 1$, $0 \leq y \leq 1$). As shown in an embodiment shown in FIGS. 2a to 2E, the second conductivity type semiconductor layer 130 may have a concavo-convex structure. Because of that, the re-emission layer 140 may be disposed conformal on the second conductivity type semiconductor layer 130 and the re-emission layer 140 may be formed in the concavo-convex structure as well. That is, the re-emission layer 140 which is a nitride semiconductor layer including indium capable of emitting a light of a long wavelength range may be disposed on the second conductivity type semiconductor layer 130. at this time, when the second conductivity type semiconductor layer 130 and the re-emission layer 140 including indium are formed in the concavo-convex structure, a relatively less tension is applied to both of the layers in comparison to a plane shape and more indium can be included accordingly.

The first electrode 150 disposed on the first conductivity type semiconductor layer 110 and the second electrode 160 disposed on the second conductivity type semiconductor layer 130 may be formed of a material selected from molybdenum, chromium (Cr), nickel (Ni), gold (Au), aluminum (Al), titanium (Ti), platinum (Pt), vanadium (V), tungsten (W), lead (Pd), copper (Cu), rhodium (Rh) and iridium (Ir) or an alloy of these metals.

According to the light emitting device according to this embodiment, a light of a first wavelength range is emitted from the light emission layer and the light of the first wavelength range is absorbed by the re-emission layer, to emit a light of a second wavelength range. Specifically, the light emission layer emits ultra violet (UV) rays and the re-emission layer absorbs the UV to emit a white light, or the light emission layer emits a blue light and the re-emission layer absorbs the blue light to emit red+green(+yellow) lights.

In other words, an electrode injected from an n-type semiconductor layer is combined with a hole injected from a p-type semiconductor layer on the light emission layer, and then a blue light or UV is emitted according to the indium composition of the light emission layer.

If the active layer emits UV, the re-emission layer may emit blue+green+yellow+red lights.

According to this embodiment of the light emitting device, the light emitted from the active layer 120 causes excitation of the re-emission layer 140 and the re-emission layer 140 emits a light. The light emitted from the re-emission layer 140 is not generated by the combination between the electrode and the hole injected via the nitride semiconductor layer but optically excited by the light emitted from the electrical light emission layer. Because of that, the light emitted from the re-emission layer 140 is very stable, with a relatively less spectrum variation generated by current increase.

FIGS. 2A to 2E are diagrams illustrating a method for fabricating a second embodiment of a light emitting device. As follows, the method for fabricating the light emitting device will be described in reference to FIGS. 2A to 2E.

This embodiment is a method for fabricating the light emitting device according to the above embodiment shown in FIG. 1 or the light emitting device including the second conductivity type semiconductor layer 130 having the surface formed in the concavo-convex structure described above.

Figure 2A:
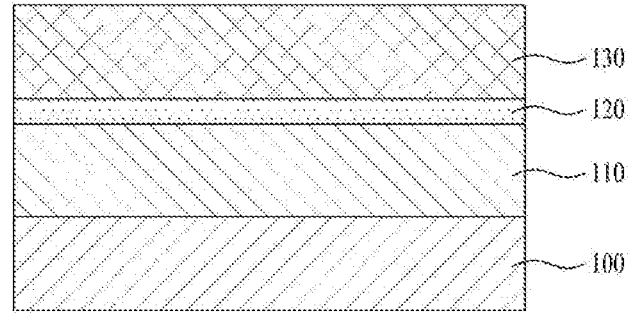
FIGS. 2A to 2E are diagrams illustrating a second embodiment of a method for fabricating a light emitting device.

First of all, as shown in FIG. 2A, a light emitting structure including a buffer layer (not shown), a first conductivity type semiconductor layer 110, an active layer 120 and a second conductivity type semiconductor layer 130 may grow on a substrate 100.

For example, the light emitting structure may be formed according to Metal Organic Chemical Vapor Deposition (MOCVD), Chemical Vapor Deposition (CVD), plasma-enhanced Chemical Vapor Deposition (PECVD), Molecular Beam Epitaxy (MBE) and Hydride Vapor Phase Epitaxy (HVPE) and the present invention is not limited thereto.

The substrate 100 includes a conductive substrate or dielectric substrate and it may use at least one selected from a group consisting of sapphire (Al2O3), SiC, Si, GaAs, GaN, ZnO, Si, GaP, InP, Ge, and Ga2O3, for example. A concavo-convex structure may be disposed on the substrate 100 and the present invention may not be limited thereto. Wet cleaning may be performed to the substrate 100 and impurities may be eliminated from a surface of the substrate 100.

The buffer layer (not shown) may grow between the light emitting structure and the substrate 100 and it is provided to reduce lattice mismatch and difference of thermal expansion coefficient. The buffer layer may be formed of a 3-5 group compound semiconductor, for example, at least one selected from a group consisting of GaN, InN, AlN, InGaN, AlGaN, InAlGaN and AlInN. An undoped semiconductor layer may be disposed on the buffer layer and the present invention may not be limited thereto.

The light emitting structure may grow according to a vapor deposition method such as Metal Organic Chemical Vapor Deposition (MOCVD), Molecular Beam Epitaxy (MBE) and Hydride Vapor Phase Epitaxy (HVPE).

Composition of the first conductivity type semiconductor layer 110 is identical to the composition described above. According to the composition, an n-type GaN layer may be formed according to Chemical Vapor Deposition (CVD), Molecular Beam Epitaxy (MBE), sputtering or Hydride Vapor Phase Epitaxy (HVPE). Silane gas (Sih4) including an n-type impurity such as trimethyl gallium gas (TMGa), ammonia gas (NH3), nitrogen gas (N2) and silicon (Si) is injected into a chamber to form the first conductivity type semiconductor layer 110.

The composition of the active layer 120 is identical to the composition described above. For example, the trimethylgallium gas (TMGa), ammonia gas (NH3), nitrogen gas (N2) and trimethylindium gas (TMIn) are injected to form a multi-quantum well structure and the present invention is not limited thereto.

The composition of the second conductivity type semiconductor layer 130 is identical to the composition described above. Bis-ethylcycropentadienylmagnesium (EtCp2Mg) {Mg(C2H5C5H4)2} including a p-type impurity such as trimethylgallium gas (TMGa), ammonia gas (NH3), nitrogen gas (N2) and magnesium (Mg) is injected into the chamber to form a p-type GaN layer and the present invention is not limited thereto.

Figure 2B:
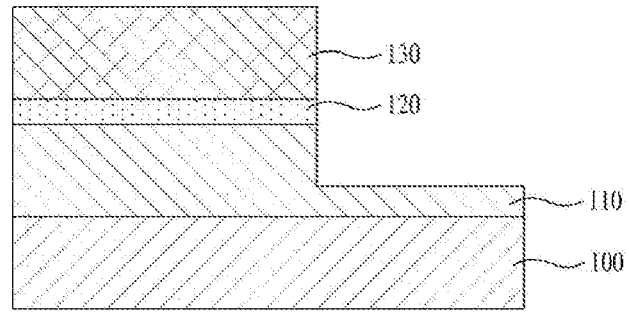

Hence, as shown in FIG. 2B, the second conductivity type semiconductor layer 130, the active layer 120 and a part of the first conductivity type semiconductor layer 110 are mesa-etched. That is, in case of using a dielectric substrate such as a sapphire substrate, an electrode cannot be disposed on a bottom of the substrate. Because of that, a predetermined space is secured to form the electrode.

Here, the electrode may be formed by mesa-etching such as Reactive Ion Etching (RIE). After the mesa-etching is completed, the part of the first conductivity type semiconductor layer 110, the active layer 120 and the second conductivity type semiconductor layer 130 may be exposed as shown in the drawing.

Figure 2C:
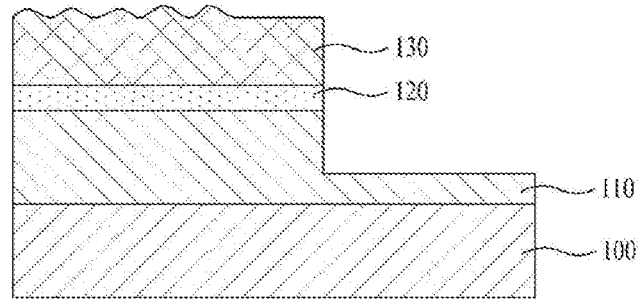

Hence, as shown in FIG. 2C, the second conductivity type semiconductor layer 130 may re-grow in a concavo-convex structure. Here, a simulation condition of a 3-dimensional growth is differentiated to grow the second conductivity type semiconductor layer 130 in the concavo-convex structure additionally.

That is, the growth speed of the second conductivity type semiconductor layer 130 is partially increased/decreased or magnesium nitride (MgNx) or silicon nitride (SiNx) is treated on a surface of the second conductivity type semiconductor layer 130, such that the concavo-convex structure may be formed. The second conductivity type semiconductor layer 130 is dry-etched by using a mask and a photonic crystal structure may be disposed on the surface of the second conductivity type semiconductor layer 130.

Alternatively, the second conductivity type semiconductor layer 130 is formed relatively thicker and after that, it is wet-etched to form the concavo-convex structure. Here, the concavo-convex structure of the second conductivity type semiconductor layer 130 may be formed before the mesa-etching process shown in FIG. 2B.

This embodiment presents that the surface of the second conductivity type semiconductor layer 130 is formed in the concavo-convex structure. When the light emitting device according to the embodiment of FIG. 1 is fabricated, that process of FIG. 2C may be omitted.

Figure 2D:
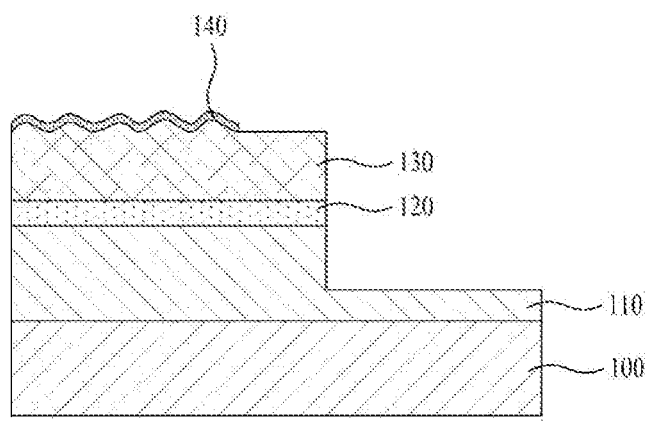

Hence, as shown in FIG. 2D, the re-emission layer 140 may grow on the second conductivity type semiconductor layer 130 and the re-emission layer 140 may grow as InGaN multi-thin-film layer with multi-thin films having different indium compositions, respectively.

At this time, the re-emission layer 140 is formed of thin films having different indium compositions, respectively. A thin film having the most indium is located upmost and a crystal defect of a thin film caused by the large indium may not be related to the electrical operation of the device accordingly.

The concavo-convex second conductivity type semiconductor layer 130 may enable a surface of the re-emission layer 140 to be unevenness-shaped as well.

At this time, the re-emission layer 140 including indium may emit a light of a long wavelength range. When the second conductivity type semiconductor layer 130 and the re-emission layer 140 including indium are formed in the concavo-convex structure, a relatively less tension is applied to both of the layers in comparison to a plane shape and more indium can be included accordingly.

Figure 2E:
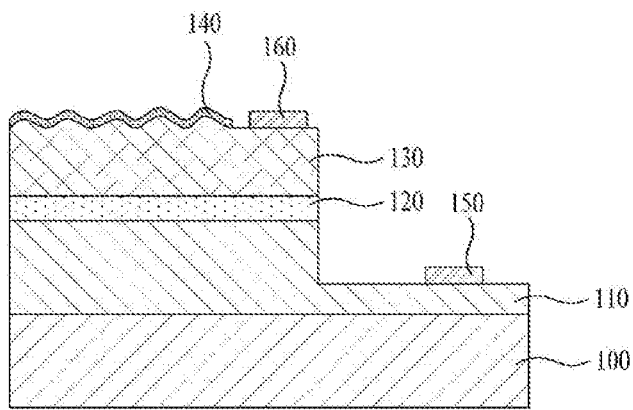

As shown in FIG. 2E, a first electrode 150 may be disposed on the first conductivity type semiconductor layer 110 and a second electrode 160 may be disposed on the second conductivity type semiconductor layer 130. A part of the second conductivity type semiconductor layer 130 may not have the concavo-convex structure and the second electrode 160 may be disposed on the part of the second conductivity type semiconductor layer 130 having no concavo-convex structure.

Alternatively, the second electrode 160 may be formed one the concavo-convex area. The first electrode 150 and the second electrode 160 may be formed in a unilayer structure or a multilayer structure including at least one selected from a group consisting of aluminum (Al), titanium (Ti), chromium (Cr), nickel (Ni), copper (Cu) and gold (Au).

The light emitting device of this embodiment fabricated according to the method described above may have improved luminous efficiency, because the concavo-convex structure is disposed on the second conductivity type semiconductor layer 130 and because the re-emission layer 140 having indium receives less tension on the concavo-convex structure.

In addition, a part or all of lights emitted from the active layer generates excitation of the re-emission layer disposed on the concavo-convex area and lights from a yellow light to a red light of the long wavelength range may be generated. As a result, a blue light emitted from the light emission layer is added to a green light, a yellow light and a red light emitted from the re-emission layer, to present a white light.

The re-emission layer including indium is located on the top of the light emitting device and the re-emission layer receives less tension on the concavo-convex structure. Because of that, internal quantum luminous efficiency of a material may be enhanced significantly. A crystal surface and various distribution of a tension on the concavo-convex structure may promote phase-separation of indium performed in the nitride semiconductor thin film having indium. Because of that, a broad spectrum may be emitted spontaneously.

As a result, the large indium content capable of emitting lights of the long wavelength range may be provided on the concavo-convex structure and the nitride thin films having different indium compositions are deposited in a multilayer structure, only to replace a conventional fluorescent substance effectively.

The above embodiment is described based on a horizontal structure chip and the present invention is not limited thereto. The embodiment may be applicable to a vertical structure or flip structure.

In other words, the re-emission layer is disposed on a top of the vertical structure chip or the flip structure chip. A light of a first wavelength range excited from the active layer may be converted into a light of a second wavelength range longer than the first wavelength range.

Figure 2F:
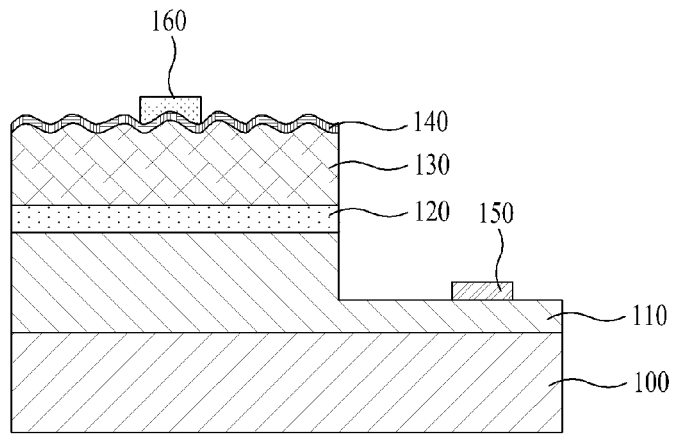
FIG. 2F is a side sectional view illustrating a third embodiment of a light emitting device.

FIG. 2F is a side sectional view illustrating a third embodiment of a light emitting device.

This embodiment is similar to the second embodiment described above except the re-emission layer 140 disposed on an entire surface of the second conductivity type semiconductor layer 130. The second electrode 160 may be disposed in contact with the re-emission layer 140.

Here, the composition of the re-emission layer 140 is identical to the embodiments described above. Because of that, an area of the re-emission layer 140 may be increased and a wavelength conversion effect of the light emitted from the active layer 120 may be enhanced.

Figure 2G:
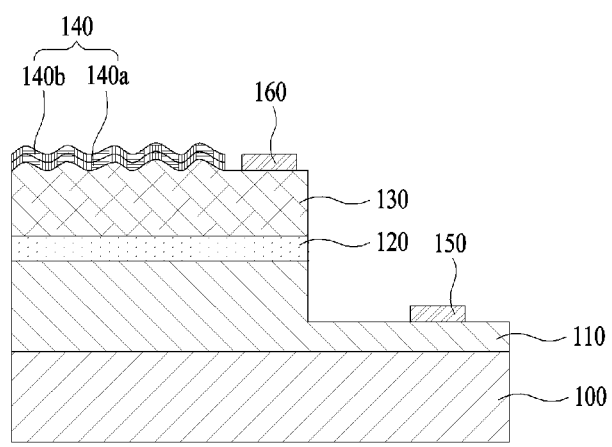
FIG. 2G is a side sectional view of one aspect of a second embodiment of a light emitting device.

FIG. 2G is a side sectional view of one aspect of a second embodiment of a light emitting device. Here, a re-emission layer 140 is illustrated with thin films having different indium compositions 140a, 140b.

Figure 3:
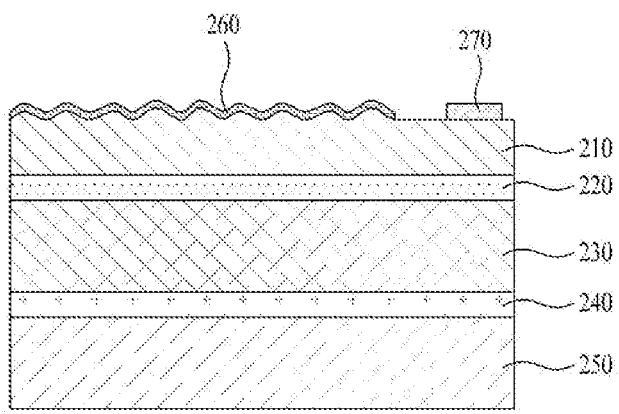
FIG. 3 is a side sectional view illustrating a fourth embodiment of a light emitting device.

FIG. 3 is a side sectional view illustrating a fourth embodiment of a light emitting device. As follows, the fourth embodiment of the light emitting device will be described in reference to FIG. 3.

The light emitting device according to this embodiment includes an ohmic layer 240, a second conductivity type semiconductor layer 230, an active layer 220 and a first conductivity type semiconductor layer 210 which are provided on a metal support 250.

Here, the metal support 250 may be employed as electrode. Because of that, a predetermined metal having good electrical conductivity may be used to form the metal support 250. A predetermined metal having high heat conductivity may be used to form the metal support 250, because the metal support 250 has to radiate heat generated during the operation of the device. The metal support 250 may be formed of one material selected from a group of molybdenum (Mo), silicon (Si), tungsten (W), copper (Cu) and aluminum (Al) or it may be formed of an alloy of the group. The metal support 250 may selectively include gold (Au), copper alloy (Cu Alloy), nickel (Ni), copper-tungsten (Cu—W), carrier wafer (for example, GaN, Si, Ge, GaAs, ZnO, SiGe, SiC, SiGe and Ga2O). In addition, the metal support 250 has to have an enough mechanical strength not to cause warpage of an overall nitride semiconductor and to separate the semiconductor as independent chip in a scribing process and a breaking process.

The second conductivity type semiconductor layer 230 has a low impurity doping concentration and it has a high contact resistance accordingly, only to make an ohmic property not good. As a result, a transparent electrode may be disposed on the second conductivity type semiconductor layer 230 as ohmic layer 240, to improve such an ohmic property.

The thickness of the ohmic layer 240 may be approximately 200 angstroms. The ohmic layer 240 may include at least one selected from a group consisting of ITO (indium tin oxide), ITO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Sn, In, Ru, Mg, Zn, Pt, Au and Hf, and the present invention is not limited thereto.

Although not shown in the drawing, a reflective layer and/or an adhesion layer may be disposed between the ohmic layer 240 and the metal support 250.

The thickness of the reflective layer may be approximately 2500 angstroms. The reflective layer may be formed of a metal layer including aluminum (Al), silver (Ag), nickel (Ni), platinum (Pt), rhodium (Rh) or an alloy including Al, Ag, Pt or Rh. The aluminum, the silver or the like may reflect a light generated from an active layer 130 effectively, only to improve light extraction efficiency remarkably.

To bond the reflective layer with the metal support 250, the reflective layer may perform a function of an adhesion layer or an auxiliary adhesion layer may be formed. The adhesion layer may be formed of a predetermined material selected from a group configured of gold (Au), tin (Sn), indium (In), aluminum (Al), silicon (Si), silver (Ag), nickel (Ni), platinum (Pt) and copper (Cu) or it may be formed of an alloy of the above materials.

The compositions of the second conductivity type semiconductor layer 230, the active layer 220 and the first conductivity type semiconductor layer 210 are identical to the composition of the embodiments described above.

According to this embodiment, the first conductivity type semiconductor layer 210 has a concavo-convex structure and the re-emission layer 260 having a concavo-convex structure may be disposed on the first conductivity type semiconductor layer 210. That is, according to the first to third embodiments, the re-emission layer 140 is disposed on the second conductivity type semiconductor layer 130. However, according to this embodiment, the re-emission layer 260 is disposed on the first conductivity type semiconductor layer 210.

Here, the re-emission layer 260 may grow as InGaN multi-thin-film layer configured of multi-thin films having different indium compositions, respectively. At this time, the re-emission layer 260 is configured of thin films having different indium compositions and a thin film having a content of indium content is located upmost and a crystal defect of a thin film caused by the large indium may not be related to the electrical operation of the device accordingly, as described above.

The light emitting device according to this embodiment may have at least one of np, pn, npn and pnp junction structures.

FIGS. 4A to 4G are diagrams illustrating a method for fabricating a fifth embodiment of a light emitting device. As follows, the method for fabricating the fifth embodiment of the light emitting device will be described in reference to FIGS. 4A to 4G.

Figure 4A:
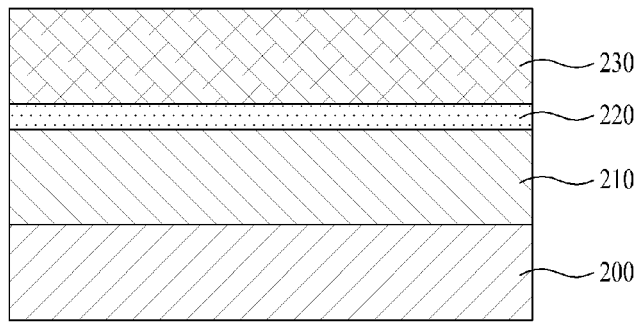
FIGS. 4a to 4G are diagrams illustrating a fifth embodiment of a method for fabricating a light emitting device.

First of all, as shown in FIG. 4A, on a substrate 200 may grow a buffer layer (not shown) and a light emitting structure including a first conductivity type semiconductor layer 210, an active layer 220 and a second conductivity type semiconductor layer 230.

The composition of the light emitting structure and the method of growing each of the layers are identical to the embodiments described above.

Figure 4B:
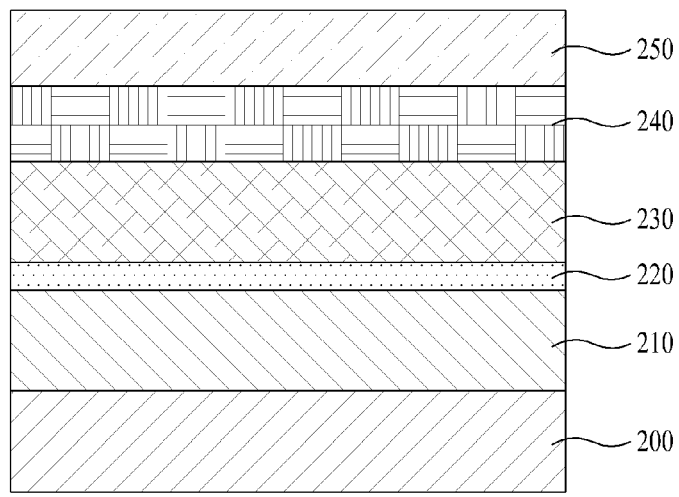
Figure 4C:
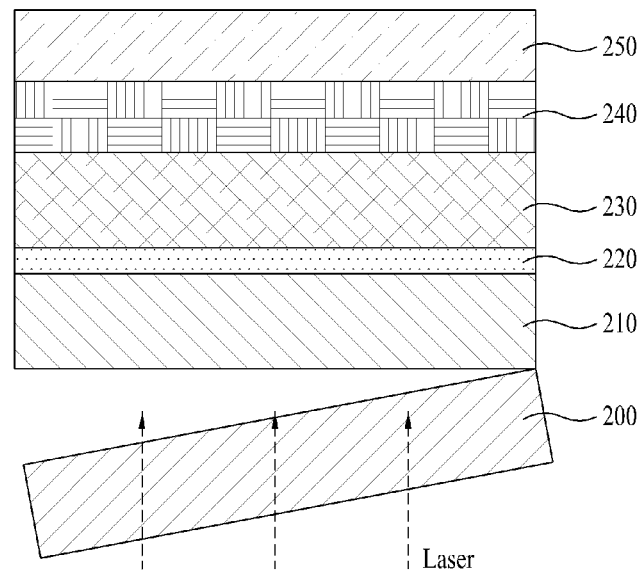

As shown in FIG. 4B, an ohmic layer 240 and a metal support 250 are disposed on the second conductivity type semiconductor layer 230.

The composition of the ohmic layer 240 is identical to the embodiments described above and the ohmic layer 240 may be formed according to Sputtering or Electron Beam Vapor Deposition.

A reflective layer (not shown) may be disposed between the ohmic layer 240 and the metal support 250 and the thickness of the reflective layer (not shown) may be approximately 2500 angstroms. The reflective layer (not shown) may be formed of a metal layer including aluminum (Al), silver (Ag), nickel (Ni), platinum (Pt), rhodium (Rh) or an alloy having Al, Ag or Pt. The aluminum and silver may reflect a light generated from the active layer 220 effectively and light extraction efficiency of the light emitting device may be improved remarkably.

The composition of the metal support 250 may be identical to the composition described above. The metal support 250 may be formed according to Electro-Chemical Metal Deposition or Bonding which uses a eutectic metal. To bond the reflective layer (not shown) with the metal support 250, the reflective layer may be employed as adhesion layer (not shown). Alternatively, an adhesion layer may be formed of a selected material from a group configured of gold (Au), tin (Sn), Indium (In), aluminum (Al), silicon (Si), silver (Ag), nickel (Ni) and copper (Cu) or the adhesion layer 150 may be formed of an alloy of these materials.

Figure 7:
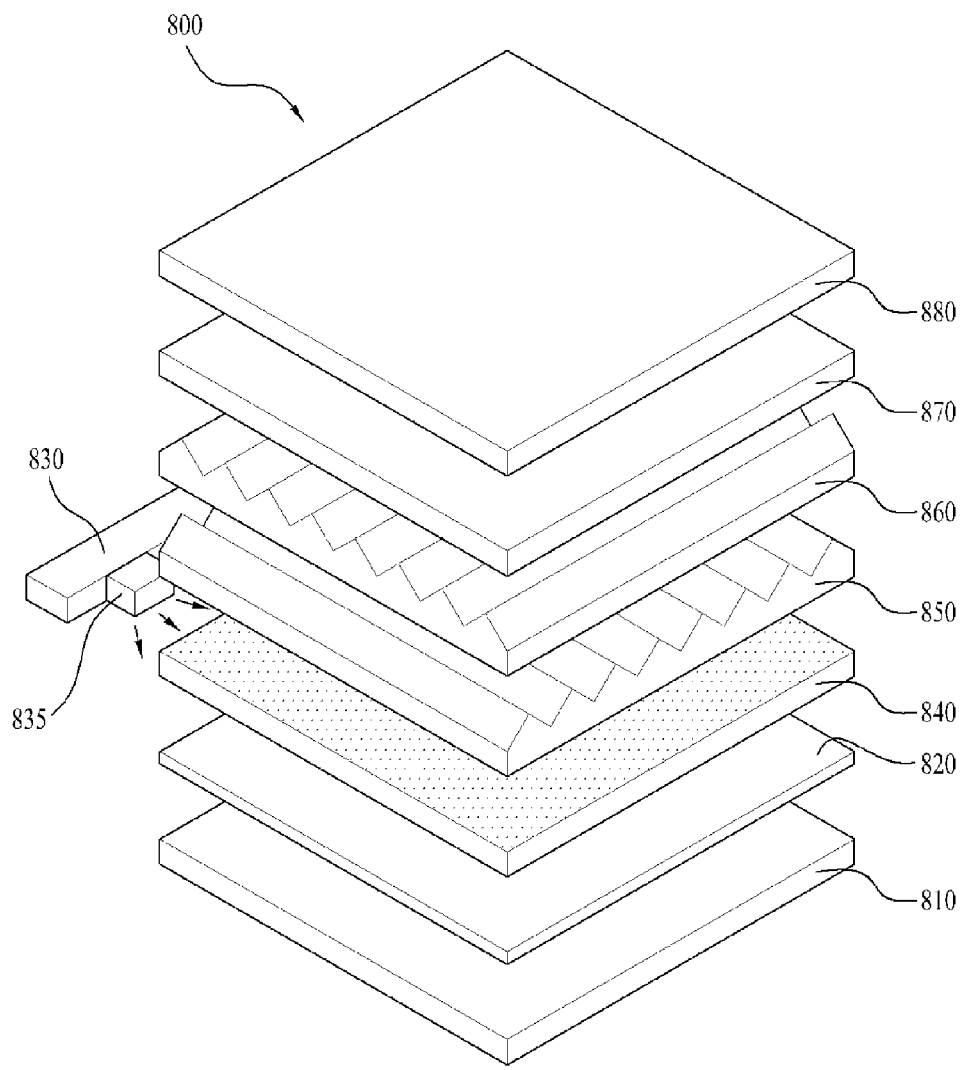
FIG. 7 is a diagram illustrating a display device including the light emitting device package.

As shown in FIG. 7, the substrate 200 is separated. Removal of the substrate 200 may be performed according to Laser Lift Off (LLO), Dry and Wet Etch.

For example, the removal of the substrate 200 may be performed according to Laser Lift Off (LLO). An excimer laser beam of a predetermined wavelength is focused on a predetermined region of the substrate 200 and the beam is irritated. If then, a thermal energy is concentrated on a border surface between the substrate 200 and the light emitting structure. Because of that, the border surface is divided into gallium and nitride molecules. At the same time, the separation of the substrate 200 momentarily occurs at a region where the laser beam passes.

Figure 4D:
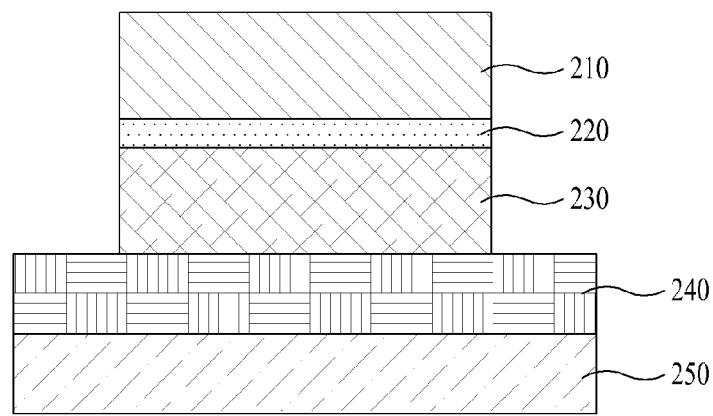

FIG. 4D illustrates the light emitting structure diced into device units.

Figure 4E:
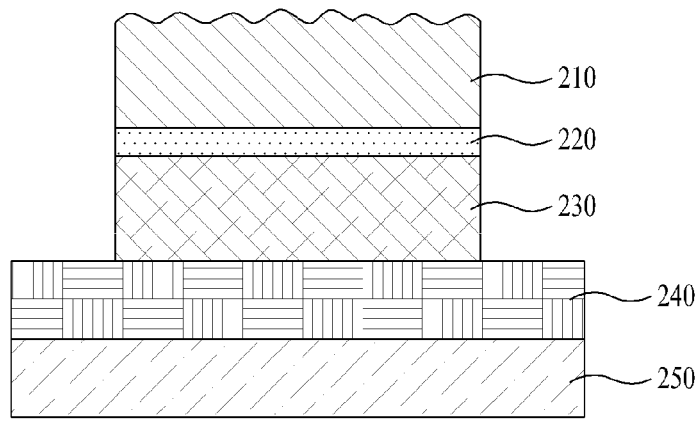

As shown in FIG. 4E, the first conductivity type semiconductor layer 210 re-grow in a concavo-convex structure. Here, a simulation condition of a 3-dimensional growth is differentiated to grow the second conductivity type semiconductor layer 210 in the concavo-convex structure additionally. The formation of the concavo-convex structure is identical to the formation described in the second embodiment of the light emitting device.

Figure 4F:
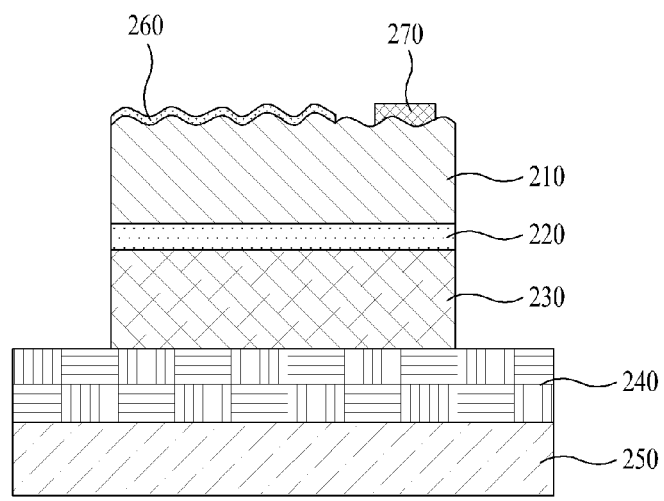
Figure 4G:
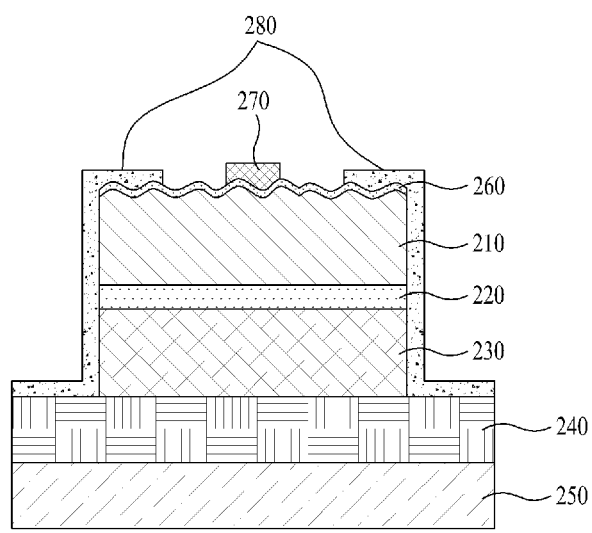

As shown in FIG. 4F, the re-emission layer 260 grows on the second conductivity type semiconductor layer 210. Here, the re-emission layer 260 may grow as InGaN multi-thin-film layer with each thin film having a different indium composition. The detailed composition of the re-emission layer 260 is identical to the composition of the above embodiment.

As shown in FIG. 4F, a second electrode 270 may be disposed on the re-emission layer 260 and a passivation layer 280 may be deposited on a side surface of the light emitting structure.

Different from the embodiment shown in FIG. 3, the embodiment presents that the re-emission layer 260 is disposed on a front surface of the first conductivity type semiconductor layer 210 and that the second electrode 270 is disposed in contact with the re-emission layer 260. The second electrode 270 may be formed in a unilayer structure or a multilayer structure including at least one selected from a group consisting of aluminum (Al), titanium (Ti), chromium (Cr), nickel (Ni), copper (Cu) and gold (Au).

The passivation layer 280 may be formed of a dielectric material and the dielectric material may be non-conductivity oxide or nitride. For example, the passivation 280 may be formed of a silicon oxide ($SiO_2$) layer, an oxy-nitride layer and an oxy-aluminum layer.

The light emitting device according to this embodiment fabricated in the above process may include the light emission layer emitting a light of a first wavelength range and the re-emission layer absorbing the light of the first wavelength range, such that a light of a second wavelength range may be emitted.

According to the embodiments of the light emitting device described above, the re-emission layer is disposed on the first conductivity type semiconductor layer or the second conductivity type semiconductor layer. Alternatively, the re-emission layer may be disposed on each surface of the first conductivity type semiconductor layer and the second conductivity type semiconductor layer.

Figure 5:
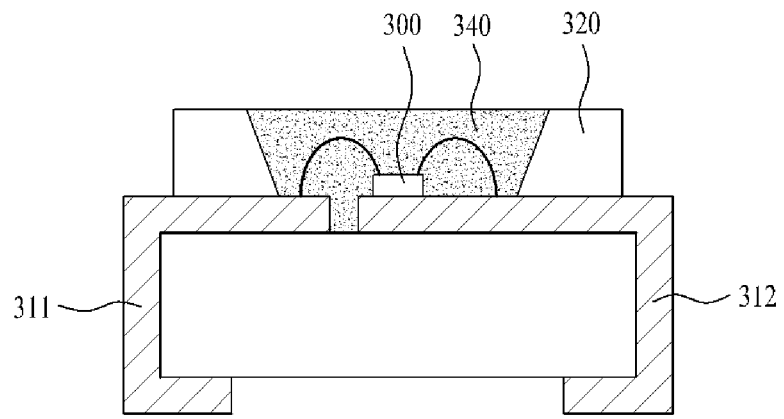
FIG. 5 is a diagram illustrating an embodiment of a light emitting device package.

FIG. 5 is a sectional view illustrating a light emitting device package according to an embodiment. As follows, the light emitting device package according to the embodiment will be described in reference to FIG. 5.

As shown in FIG. 5, the light emitting device package according to this embodiment includes a package body 320, first and second electrode layers 311 and 312 installed in the package body 320, a light emitting device 300 installed in the package body 320, with being electrically connected with the first and second electrodes 311 and 312, and a filling material 340 surrounding the light emitting device 300.

The package body 320 includes silicon, synthetic resin material or metal. A slope is formed adjacent to the light emitting device 300 and light extraction efficiency may be enhanced.

The first electrode layer 311 and the second electrode layer 312 are electrically independent from each other, and they provide the light emitting device 300 with an electric voltage. In addition, the first and second electrode layers 311 and 312 reflect a light generated from the light emitting device 300, to improve luminous efficiency, and they may exhaust the heat generated from the light emitting device 300 outside.

The light emitting device 300 may be installed on the package body 320 or either of the first electrode layer 311 and the second electrode layer 312. The light emitting device 300 may be electrically connected with the first and second electrodes 311 and 312 by at least one of wire-bonding, flip chip-bonding or die-bonding.

The filling material 340 surrounds the light emitting device 300 to protect the light emitting device 300. A phosphor is provided in the filling material 340 and a wavelength of a light emitted from the light emitting device may be converted. Here, this embodiment may not include the phosphor in the filling material 340 because of the re-emission layer 140.

According to this embodiment of the light emitting device package, the re-emission layer provided in the light emitting device 300 is excited and the light is emitted. Because of that, a light having relatively less spectrum change caused by current increase and stability may be emitted.

One light emitting device or a plurality of light emitting devices according to at least one of the embodiments described above may be may be mounted on the light emitting device package, and the present invention is not limited thereto.

The plurality of the light emitting device packages according to the embodiment may be arrayed on the substrate. A light guide plate, a prism sheet and a diffuser sheet, which are optical elements, may be arranged on a light passage of the light emitting device package. Such the light emitting device package, the substrate and the optical elements may be functioned as light unit. Another embodiment of the present invention may present a display device, a pointing device and a lightening system which include the semiconductor light emitting device or light emitting device package disclosed in the embodiments described above. For example, the lightening system may include a lamp and a streetlamp. As follows, a lightening device and a backlight unit will be described as examples of the lightening system having the light emitting device package arranged therein.

Figure 6:
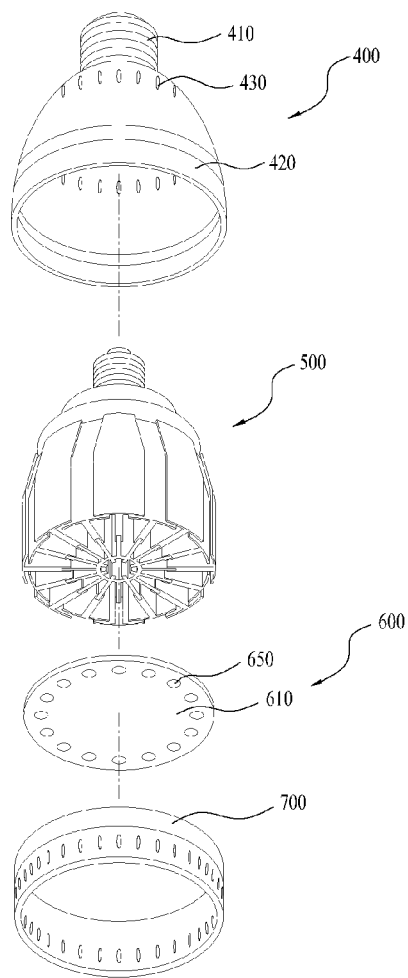
FIG. 6 is an exploded perspective view illustrating an embodiment of a lightening device including the light emitting device package.

FIG. 6 is an exploded perspective view illustrating an embodiment of a lightening device having the light emitting device package.

The lightening device according to this embodiment includes a light source 600 configured to project a light, a housing 400 where the light source 600 is mounted, a heat radiating part 500 configured to radiate heat of the light source 600, and a holder 700 configured to connect the light source 600 and the heat radiating part 500 with the housing 400.

The housing 400 includes a socket-secured part 410 secured to an electric socket (not shown) and a body part 420 connected with the socket-secured part 410, with the light source 600 mounted therein. A single air hole 430 may be formed through the body part 420.

The plurality of the air holes 430 may be formed in the body part 420 of the housing 400. The air hole 430 may be a single hole or the plurality of the air holes may be arranged in a radial direction. Here, various arrangements of the plurality of the air holes may be possible, rather than the radial arrangement.

The light source 600 includes a substrate 610 and a plurality of light emitting packages 650 arranged on the substrate 610. The substrate 610 may have a predetermined shape to be inserted in an opening of the housing 400 and it may be formed of a material having a high thermal conductivity to transmit heat to the heat radiating part 500.

The holder 700 may be provided under the light source and it may include a frame and another air hole. Although not shown in the drawing, optical elements may be provided under the light source 600 and lights emitted from the light emitting device package 650 may be diffused, scattered or collected.

According to this embodiment of the lightening device, the re-emission layer provided in the light emitting device 300 is excited only to emit the light. Because of that, a light having relatively less spectrum change caused by current increase and stability may be emitted.

FIG. 7 is a diagram illustrating a backlight including the light emitting device package.

As shown in FIG. 7, a display device 800 according to this embodiment includes light source modules 830 and 835, a reflective plate 820 provided on a bottom cover 810, a light guide plate 840 arranged on a front surface of the reflective plate 820 to guide a light emitted from the light source modules forwardly, first and second prism sheets 850 and 860 arranged on a front of the light guide plate 840, a panel 870 arranged on a front of the second prism sheet 860, and a color filter 880 arranged on an overall area of the panel 870.

The light source module 830 includes a substrate 830 and a light emitting device package 835 provided on the substrate 830. Here, the substrate 830 may be a PCB and the light emitting device package 835 is described in reference to FIG. 5.

The bottom cover 810 may hold inner components of the display device 800. The reflective plate 820 may be an auxiliary component as shown in the drawing or the reflective sheep 820 disposed of a material having high reflectivity may be coated on a front surface of the bottom cover 810.

The material which can be used to be ultra-thin film type with a high reflectivity may be the reflective plate 820 and polyethylene terephtalate (PET) may be used as reflective plate 820.

The light guide plate 830 scatters the lights emitted from the light emitting device package modules to distribute the lights to an overall screen area of a liquid crystal display device uniformly. Because of that, the light guide plate 830 may be formed of a material having a good refractive index and transmissivity, for example, polymethylmethacrylate (PMMA), polycarbonate (PC) and polyethylene (PE).

The first prism sheet 850 is formed in a surface of a supporting film and it is formed of polymer having transparency and elasticity. The polymer may have prism layers having a plurality of conformation structures formed repeatedly. The plurality of the patterns may be ribbed and grooved repeatedly in a stripe type, as shown in the drawing.

A direction of the ribbed and grooved shape formed in the surface of the supporting film provided in the second prism sheet 860 may be perpendicular to a direction of the ribbed and grooved shape formed in the surface of the supporting film provided in the first prism sheet 850. This is because the lights transmitted from the light source module and the reflective sheet have to be distributed in a forward direction of the panel 870 uniformly.

Although not shown in the drawing, a protection sheet may be provided on each of the prism sheets and the protection sheet may include a light diffusive element and binder provided on both surfaces of the supporting film. The prism layer may be formed of a polymer material selected from a group including polyurethane, butadiene-styrene copolymers, polyacrilate, Polymethacrylate, Polymethyl Methacrylate, polyethylene terephthalate elastomer, polyisoprene and polysilicon.

Although not shown in the drawing, a diffuser sheet may be arranged between the light guide plate 840 and the first prism sheet 850. The diffuser sheet may be formed of a polyester and polycarbonate group material and a light incident from a backlight unit is refracted and scattered, such that a light projection angle may be broadened as much as possible. The diffuser sheet includes a supporting layer having a light-diffusing agent and first and second layers formed in a light emitting surface (toward the first prism sheet) and a light incident surface (toward the reflective sheet), respectively, with no light-diffusing agent.

The supporting layer may include a siloxane-group light diffusing agent 0.1~10 weight part, having an average particle size in the range of 1~10 micrometers and an acryl-group light diffusing agent 0.1~10 weight, having an average particle size in the range of 1~10 micrometers, with respect to a resin part by 100 weight which is mixed with methacrylic acid-styrene copolymer and methyl methacrylate-styrene copolymer.

The first and second layers may include an ultraviolet ray absorbent 0.01~1 weight part and an antistic agent 0.0001~10 weight part, with respect to a methyl methacrylate-styrene copolymer resin 100 weight part.

The thickness of the supporting layer provided in the diffuser sheet is 100~10000 micrometers and the thickness of each of the first and second layers is 10~1000 micrometers.

According to this embodiment, the diffuser sheet, the first prism sheet 850 and the second prism sheet 860 composes an optical sheet. The optical sheet may be configured of other compositions of a micro-lens array, a diffuser sheet and a micro-lens array or a single prism sheet and a micro-lens array, for example.

The panel 870 may be arranged on a liquid crystal display and other types of display devices requiring a light source may be provided, rather than the liquid crystal display panel 860.

In the panel 870, liquid crystal is located between glass bodies and a polarizer is lifted on the glass bodies to uses polarization of lights. The liquid crystal has an in-between property of liquid and solid. Liquid crystal which is an organic molecule is arranged regularly like crystal and a property of the molecule arrangement changed by an external field is used to display an image.

The liquid crystal display used in the display device has an active matrix type which uses a transistor as switch adjusting a voltage supplied to each of pixels.

The color filter 880 is provided on a front surface of the panel 870 and it transmits only red, green blue lights of the light projected from the panel 870 via pixels. Because of that, the image may be presented.

According to this embodiment of the display device, a re-emission layer provided in the light emitting device is excited only to emit a light. Because of that, a light having relatively less spectrum change caused by current increase and stability may be emitted.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device comprising:
   a light emitting structure comprising a first conductivity type semiconductor layer, a second conductivity type semiconductor layer, and an active layer between the first conductivity type semiconductor layer and the second conductivity type semiconductor layer to emit a light of a first wavelength range; and
   a re-emission layer disposed on the light emitting structure, the re-emission layer comprising a nitride semiconductor,
   wherein the re-emission layer absorbs the light of the first wavelength range and the re-emission layer emits a light of a second wavelength range longer than the first wavelength range, and
   wherein the re-emission layer includes multi layers having different indium (In) compositions, respectively, and the indium content in the multi-layers is largest in a top layer of the multi-layers,
   wherein a top surface of the light emitting structure has a concavo-convex structure, and a top surface of the re-emission layer has a concavo-convex structure according to the concavo-convex structure of the top surface of the light emitting structure.

2. The light emitting device of claim 1, wherein the light of the first wavelength range comprises a blue light.

3. The light emitting device of claim 1, wherein the light of the first wavelength range comprises a UV light.

4. The light emitting device of claim 1, wherein the re-emission layer comprises an InGaN layer.

5. The light emitting device of claim 1, wherein the re-emission layer comprises $IN_xAl_yGa_{1-x-y}N$ layer, wherein $0 \leq x, y \leq 1$.

6. The light emitting device of claim 1, wherein the re-emission layer is disposed on the concavo-convex structure of the light emitting structure, with a predetermined thickness.

7. The light emitting device of claim 1, wherein the re-emission layer is conformally coated on the light emitting structure.

8. The light emitting device of claim 1, wherein the re-emission layer is disposed on the first conductivity type semiconductor layer or the second conductivity type semiconductor layer.

9. The light emitting device of claim 1, wherein the re-emission layer is disposed on the first or the second conductivity type semiconductor layer wherein the first or the second conductivity semiconductor layer is n-type or p-type.

10. The light emitting device of claim 1, further comprising:
    an electrode disposed on the re-emission layer.

11. The light emitting device of claim 10, wherein the electrode comprises a metal selected from a group consisting of molybdenum, chromium (Cr), nickel (Ni), gold (Au), aluminum (Al), titanium (Ti), platinum (Pt), vanadium (V), tungsten (W), lead (Pd), copper (Cu), rhodium (Rh) and iridium (Ir) or an alloy of the metals.

12. The light emitting device of claim 10, wherein a lower surface of the electrode has a concavo-convex structure according to the concavo-convex structure of the top surface of the re-emission layer.

13. The light emitting device of claim 1, further comprising:
    an ohmic layer disposed on the second conductivity type semiconductor layer.

14. The light emitting device of claim 13, wherein the ohmic layer comprises at least one selected from a group consisting of ITO, IZO, IZTO, IAZO, IGZO, IGTO, AZO, ATO, GZO, IZON, AGZO, IGZO, ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au and Hf.

15. The light emitting device of claim 13, further comprising:
    a metal support disposed on the ohmic layer.

16. The light emitting device of claim 15, wherein the metal support comprises at least one material selected from a group consisting of a group of Mo, Si, W, Cu and Al or an alloy of the group, Au, CuAlloy, Ni-nickel, Cu—W and carrier wafer.

17. The light emitting device of claim 1, wherein the re-emission layer is disposed on a surface of the first conductivity type semiconductor layer and a surface of the second conductivity type semiconductor layer.

18. A light emitting device package comprising:
    a package body;
    a light emitting device disposed on the package body; the light emitting device comprising a light emitting structure comprising a first conductivity type semiconductor layer, an active layer on the first conductivity type semiconductor layer to emit a light of a first wavelength range and a second conductivity type semiconductor layer on the active layer, with a second electrode; and a re-emission layer disposed on the second conductivity type semiconductor layer, the re-emission layer comprising a nitride semiconductor to absorb the light of the first wavelength range, to emit a light of a second wavelength range longer than the first wavelength range;

first and second electrode layers disposed on the package body, the first and second electrode layers connected with the light emitting device; and a filling material configured to surround the light emitting device, wherein the re-emission layer includes multi-layers having different indium (In) compositions, respectively, and the indium content in the multi-layer is largest in a top layer of the multi-layers, and wherein a top surface of the light emitting structure has a concavo-convex structure, and a top surface of the re-emission layer has a concavo-convex structure according to the concavo-convex structure of the top surface of the light emitting structure.

19. The light emitting device package of claim 18, wherein a lower surface of the second electrode has a concavo-convex structure according to the concavo-convex structure of the top surface of the re-emission layer.

20. A lightening system comprising:
a light source module comprising a substrate and a light emitting device disposed on the substrate;
a light guide plate configured to guide a light emitted from the light source module;
an optical sheet disposed on a front surface of the light guide plate, to diffuse the light guided from the light guide plate; and
a bottom cover configured to receive the light source module, the light guide plate and the optical sheet therein,
wherein the light emitting device comprises a light emitting structure comprising a first conductivity type semiconductor layer, an active layer on the first conductivity type semiconductor layer to emit a light of a first wavelength range, and a second conductivity type semiconductor layer on the active layer, with a second electrode disposed thereon; and a re-emission layer on the second conductivity type semiconductor layer, the re-emission layer comprising a nitride semiconductor to absorb the light of the first wavelength range, to emit a light of a second wavelength range longer than the first wavelength range,
wherein the re-emission layer includes multi-layers having different indium (In) compositions, respectively, and the indium content in the multi-layer is largest in a top layer of the multi-layers, and
wherein a top surface of the light emitting structure has a concavo-convex structure, and a top surface of the re-emission layer has a concavo-convex structure according to the concavo-convex structure of the top surface of the light emitting structure.

* * * * *